United States Patent
Culler

(10) Patent No.: US 6,294,931 B1
(45) Date of Patent: Sep. 25, 2001

(54) SYSTEMS AND METHODS FOR MAINTAINING BOARD SIGNAL INTEGRITY

(75) Inventor: Jason Harold Culler, Livermore, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/568,389

(22) Filed: May 10, 2000

(51) Int. Cl.[7] .................................................. H03K 19/00
(52) U.S. Cl. .............................. 326/60; 326/16; 326/80; 326/83
(58) Field of Search ................................. 326/59, 60, 80, 326/81, 83, 86, 16

(56) References Cited

U.S. PATENT DOCUMENTS

| | | | |
|---|---|---|---|
| 5,610,533 | * 3/1997 | Arimoto et al. | 326/33 |
| 5,798,659 | * 8/1998 | Shay et al. | 326/86 |
| 6,040,709 | * 3/2000 | Kishimoto | 326/59 |
| 6,194,915 | * 2/2001 | Nakayama et al. | 326/83 |

* cited by examiner

Primary Examiner—Michael Tokar
Assistant Examiner—Don Phu Le

(57) ABSTRACT

A circuit for altering a chip pad signal incorporates a primary driver that is configured to deliver a chip pad signal to an IC package. The circuit also is configured to cooperate with a second signal and a third signal, with the second signal having a voltage higher than the voltage of the first logic high, and the third signal having a voltage lower than the voltage of the first logic low. So configured, the primary driver may selectively deliver a second logic high, which has a voltage higher than the voltage of the first logic high, to the IC package, and may selectively deliver a second logic low, which has a voltage lower than the voltage of the first logic low, to the IC package. Electronic devices, systems and methods also are provided.

17 Claims, 5 Drawing Sheets

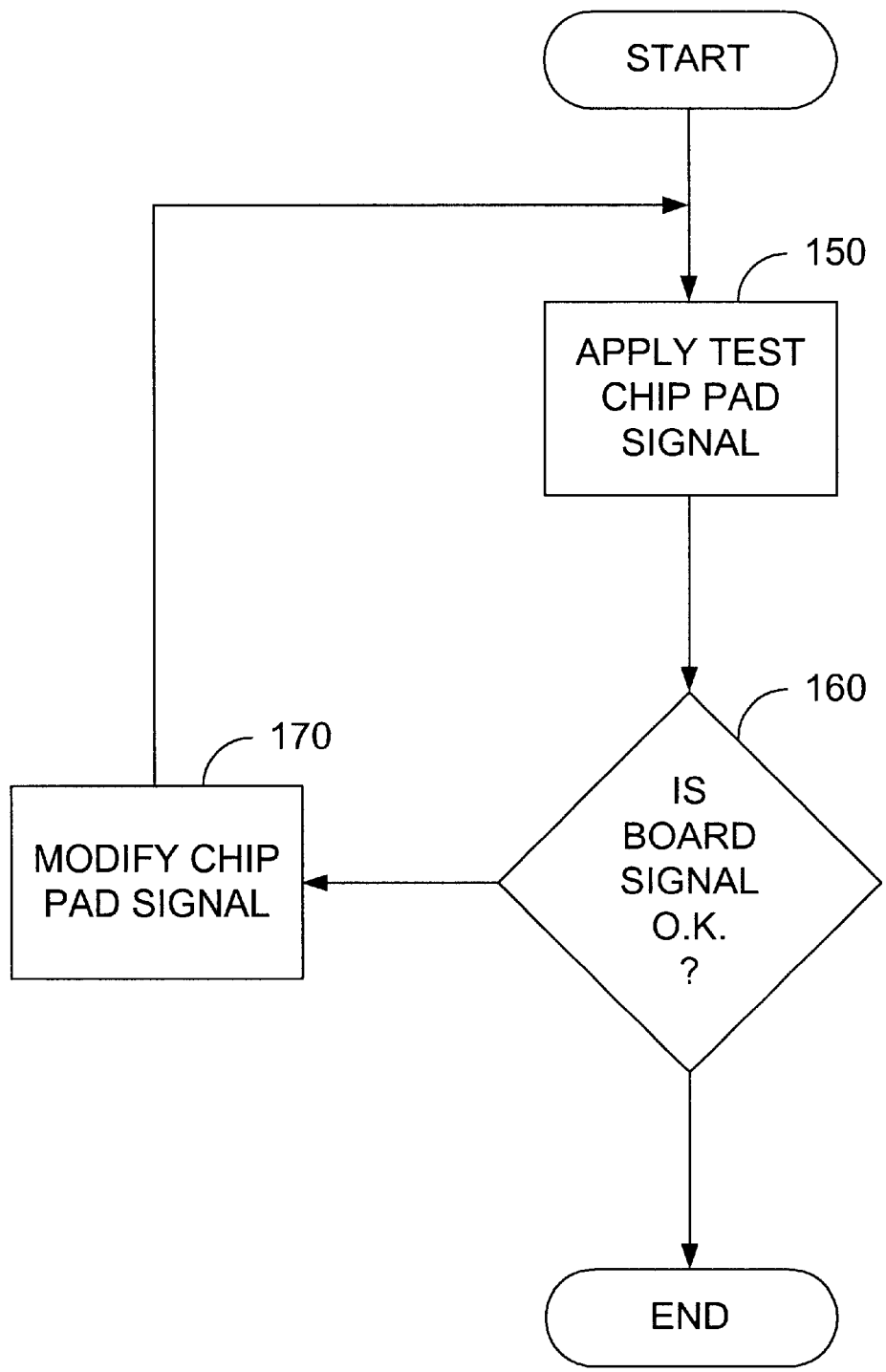

SYSTEMS AND METHODS FOR MAINTAINING BOARD SIGNAL INTEGRITY

BACKGROUND OF THE INVENTION

1. Field of the Invention

The present invention generally relates to integrated circuits and, in particular, to systems and methods for maintaining board signal integrity.

2. Description of the Related Art

Integrated circuits (IC's) are electrical circuits which incorporate transistors, resistors, capacitors, and other components onto a single semiconductor "chip" in which the components are interconnected to perform a given function. Typical examples of IC's include microprocessors, programmable logic devices (PLDs), electrically erasable programmable memory devices (EEPROMs), random access memory devices (RAMs), operational amplifiers and voltage regulators, among others. Typically, such IC's are incorporated into an electronic system by packaging the IC's, e.g., providing interconnections between and/or among various IC's and/or other electronic components for providing transmission paths for signals of the electronic system.

During transmission through an electronic system, signals are propagated among and/or through various components. For instance, a signal, e.g., a chip pad signal, typically is provided to the pad(s) of a package, with the package then providing another signal, e.g., a board signal, to a mother board, for example. Since signals, such as chip pad signals, are being adapted with what appear to be ever-increasing frequencies, these signals tend to be distorted by interfaces, such as driver-to-package and package-to-board interfaces, for instance, oftentimes resulting in less than desired electrical performance of the system.

Therefore, there is a need for devices, systems and methods which address these and other shortcomings of the prior art.

SUMMARY OF THE INVENTION

Briefly described, the present invention generally relates to systems and methods for maintaining board signal integrity. In a preferred embodiment, a circuit for altering a chip pad signal is provided. As is known, a chip pad signal is configured to provide a first logic high and a first logic low to an IC package, with the first logic high having a voltage higher than a voltage of the first logic low. The circuit incorporates a primary driver that is configured to deliver a chip pad signal to an IC package. The circuit also is configured to cooperate with a second signal and a third signal, with the second signal having a voltage higher than the voltage of the first logic high, and the third signal having a voltage lower than the voltage of the first logic low. So configured, the primary driver may selectively deliver a second logic high, which has a voltage higher than the voltage of the first logic high, to the IC package, and driver may selectively deliver a second logic low, which has a voltage lower than the voltage of the first logic low, to the IC package.

In accordance with another aspect of the present invention, an alternative embodiment of the present invention includes a primary driver which incorporates a primary driver first input, a primary driver second input, a primary driver third input, a primary driver fourth input and a primary driver output, with the primary driver being configured to deliver a chip pad signal, via the primary driver output, to an IC package. Typically, the chip pad signal is delivered in response to inputs from a primary driver first signal, a primary driver second signal, a primary driver third signal, and a primary driver fourth signal. More specifically, the primary driver first signal and the primary driver second signal each are adapted to provide a logic high and a logic low to the primary driver, via the primary driver first input and the primary driver second input, respectively, so that, in response to a logic high received concurrently from the primary driver first signal and the primary driver second signal, the primary driver provides the primary driver third signal as the chip pad signal. Likewise, in response to a logic low received from either the primary driver first signal or the primary driver second signal, the primary driver provides the primary driver fourth signal as the chip pad signal.

Additionally, the circuit is configured to receive a fifth signal having a voltage higher than a voltage of the primary driver third signal, and a sixth signal having a voltage lower than a voltage of said primary driver fourth signal so that the chip pad signal is adapted to be formed from at least three of the group consisting of: (1) the primary driver third signal; (2) a summation of the fifth signal and the primary driver third signal; (3) the primary driver fourth signal, and; (4) a summation of the sixth signal and the primary driver fourth signal.

In accordance with another aspect of the present invention, electrical devices and systems incorporating an IC package and a circuit, as described herein, are provided.

In accordance with another aspect of the present invention, a preferred method for providing a chip pad signal to an IC package includes the steps of: (1) applying a test chip pad signal to the IC package, the test chip pad signal corresponding to a chip pad signal to be applied to the IC package during operation of the IC package; (2) determining whether the board signal provided by the IC package in response to the test chip pad signal is acceptable, and; (3) if the board signal is not acceptable, modifying the chip pad signal to be applied to the IC package during operation of the IC package.

Other objects, features, and advantages of the present invention will become apparent to one with skill in the art upon examination of the following drawings and detailed description. It is intended that all such objects, features, and advantages be included herein within the scope of the present invention, as defined in the appended claims.

BRIEF DESCRIPTION OF THE SEVERAL VIEWS OF THE DRAWINGS

The present invention, as defined in the claims, can be better understood with reference to the following drawings. The drawings are not necessarily to scale, emphasis is instead being placed on clearly illustrating the principles of the present invention.

FIG. 5 is a flow diagram depicting a preferred method of the present invention.

DETAILED DESCRIPTION OF A PREFERRED EMBODIMENT

Figure 1:
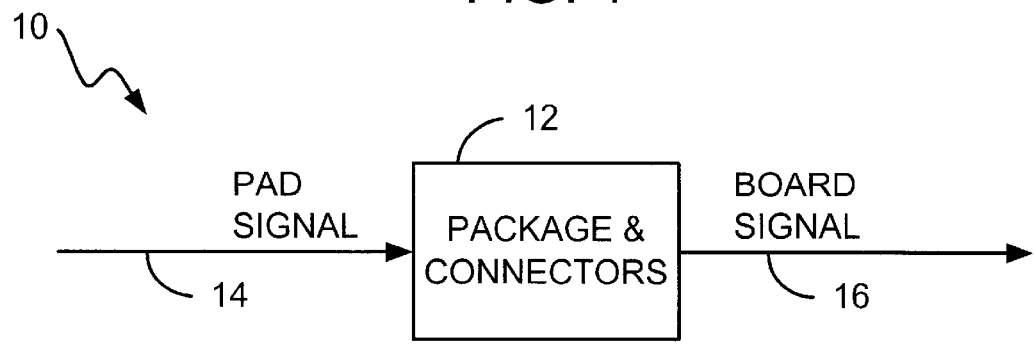
FIG. 1 is schematic diagram depicting a representative signal transmission path.

Reference will now be made in detail to the description of the invention as illustrated in the drawings with like numerals indicating like parts throughout the several views. As mentioned hereinbefore, the present invention relates to systems and methods for maintaining board signal integrity such as by pre-altering chip pad signals. As depicted in FIG. 1, a representative signal transmission path 10 includes an IC package 12, which incorporates various connectors (not shown) for providing interconnectivity to signal transmission lines, i.e., input line 14 and output line 16. So configured, a chip pad signal may be delivered to the IC package 12 via input line 14, and a board signal may be delivered from the IC package to a mother board, for example, via output line 16.

Figure 2:
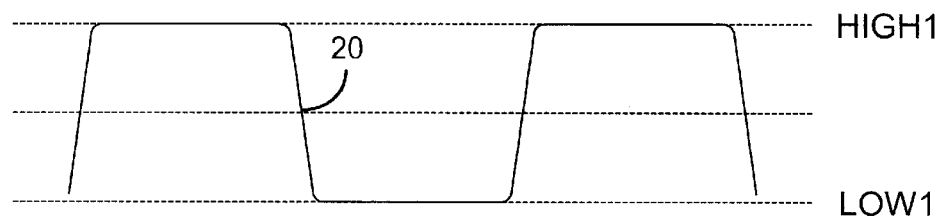
FIG. 2 is graph depicting a representative (desired) board signal corresponding to the signal transmission path of FIG. 1.

A representative (desired) board signal 20 corresponding to the signal transmission path 10 is depicted in FIG. 2. As shown therein, the board signal exhibits the desired qualities of being stable, full voltage, and noise free as the signal transitions from HIGH1 to LOW1, and vice versa. It should be noted that various other voltages may be utilized for HIGH1 and LOW1 depending upon the particular application, with such other voltages being considered well within the scope of the present invention.

As is known, package, connector and other transmission path characteristics may influence a board signal such that the board signal exhibits less than desirable characteristics. Such characteristics may include reduced voltage, voltage reflections, and slow signal transition times, for example. Because of this, much effort heretofore, has been devoted to altering such a board signal by providing and/or adjusting Process, Voltage, Temperature (PVT) controls which typically reside within the package. Altering a board signal by providing and/or adjusting PVT controls, however, may require the addition of features, such as metal routing resources, complex on-chip circuits, package space, and board pins, among others, to IC's of the package. However, given the inherent differences in performance characteristics, even between consecutively manufactured packages, the addition of features to all like packages still may result in some of the packages providing board signals with less than desired characteristics. Therefore, there is a need for improved systems and methods which accommodate the transmission of a desired board signal from a package which may or may not incorporate the use of PVT controls.

Figure 3:
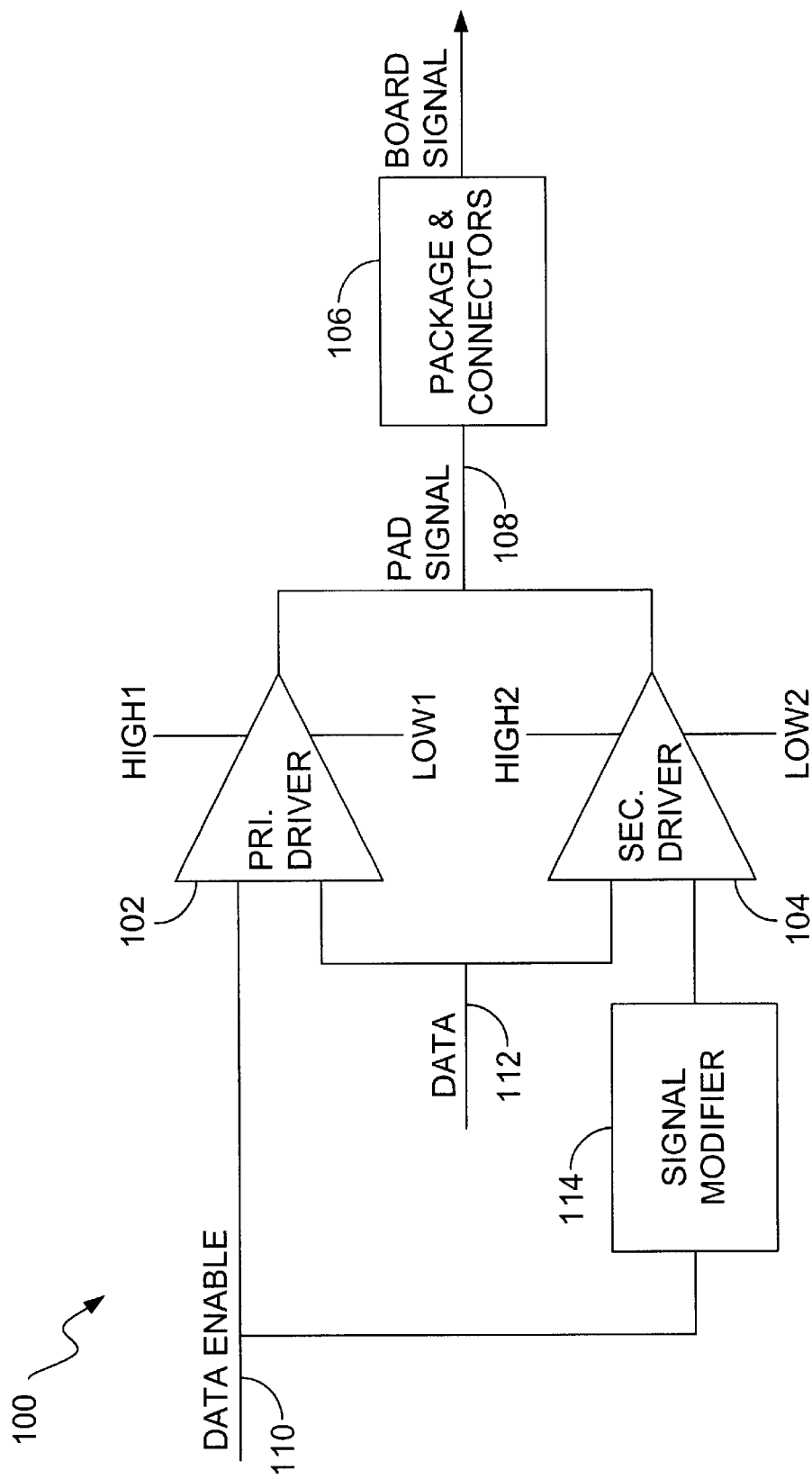
FIG. 3 is schematic diagram depicting a preferred embodiment of the present invention.

As shown in FIG. 3, a preferred embodiment of the chip pad signal pre-altering is circuit or system 100 (hereinafter "the system" or "system$_{13}$ 00") of the present invention is configured for enabling the transmission of a desired board signal from a package. As depicted therein, the system 100 preferably includes a primary driver 102 and a secondary driver 104, which each may be PVT controlled and which cooperate to provide a pad signal to a package 106 via line 108. Primary driver 102 receives inputs from a data-enable line 110 and a data line 112 and is configured to provide signals, preferably in the form of either HIGH1 or LOW1 to the package 106 via line 108.

Secondary driver 104 receives one of its inputs from the data line 112. The data-enable input to the secondary driver preferably is modified, as compared to the data-enable input to the primary driver, such as by providing the data-enable signal of line 110 to a signal modifier 114, i.e., a pulse generator, for example. The signal modifier maybe configured to modify the data-enable signal, such as by altering pulse width, magnitude, and/or various other characteristics of the data-enable signal, so that an appropriately modified data-enable signal may be provided to the secondary driver. For example, the pulse generator may include a configurable delay circuit to allow for selectable secondary driver activation, and a variable strength pre-driver to allow for configurable secondary driver turn-on rates (thereby affecting pad signal transition times).

Figure 4:
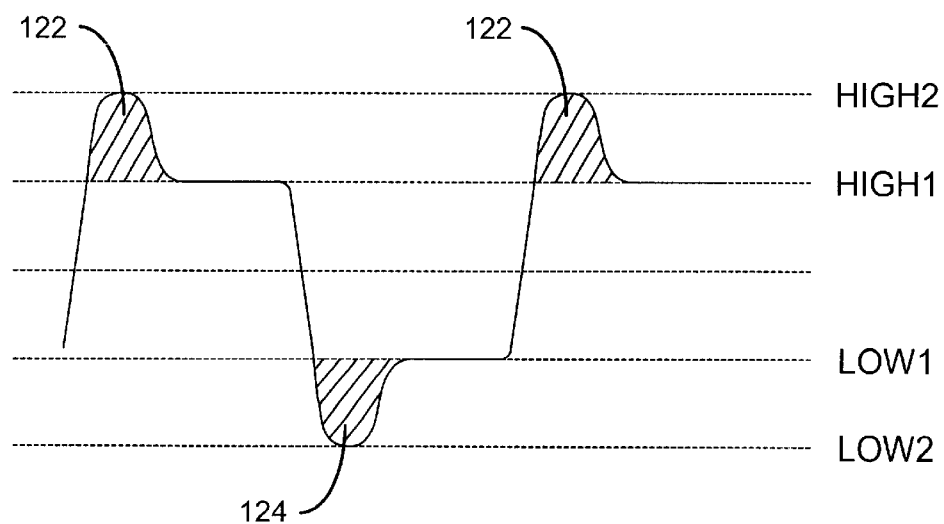
FIG. 4 is graph depicting a representative pad signal corresponding to a preferred embodiment of the present invention.

Secondary driver 104 is adapted to provide signals that bound HIGH1 and LOW1 by a $\Delta V$, preferably in the form of HIGH2 (greater than HIGH1) or LOW2 (lower than LOW1). So configured, the primary and secondary drivers interact to provide a pre-altered chip pad signal which is adapted, preferably based upon known package operating characteristics, to provide a suitable board signal. A representative example of a pre-altered chip pad signal 120 is depicted in FIG. 4. As shown therein, the chip pad signal 120 includes altered portions, 122 and 124 (portions which have been altered through utilization of the present invention, as compared to an unaltered chip pad signal, described hereinafter), with such altered portions being provided due to the interaction of the signal modifier and secondary driver with the primary driver. For instance, the portions 122 include augmentation (such as by summation) of the pad signal by HIGH2, which is applied by the secondary driver, whereas the portion 124 includes augmentation (such as by summation or termination to ground) of the pad signal by LOW2. As is well known, various other types of signal alterations may be provided and are considered well within the scope of the present invention.

Referring now to FIG. 5, a preferred method for implementing the present invention will be described. As shown therein, the method preferably begins at block 150, where a chip pad test signal is applied to an IC package of interest. At block 160, a determination is made as to whether the resultant board signal provided by the IC package meets desired criteria, i.e., proper voltage levels are realized, transition times are fat enough, and signal is noise free, among others. If it is determined that the board signal does not meet the desired criteria, the process preferably proceeds to block 170, where the chip pad signal is modified, such as by selecting a chip pad signal pre-altering system and electrically interconnecting the system upstream of the IC package. The process may then proceed back to block 150, where the chip pad test signal again is applied (this time with the signal being applied to the chip pad signal pre-altering system). The process then preferably proceeds, as described hereinbefore, until the determination is made (at block 160) that the board signal meets the desired criteria. It should be noted that if it is determined that the board signal does not meet the desired criteria after a chip pad signal pre-altering system has been electrically interconnected to the IC package, the system may be modified, such as by adding and/or removing components of the system as required, or the entire system may be replaced with another system.

Preferably, the process of determining a pre-altering setting for a secondary driver occurs during system turn-on (prior to production shipments), at power-up, and/or at various intervals during operation (every 1,000,000 cycles, for example), such that some PVT change may be taken into account.

Figure 6:
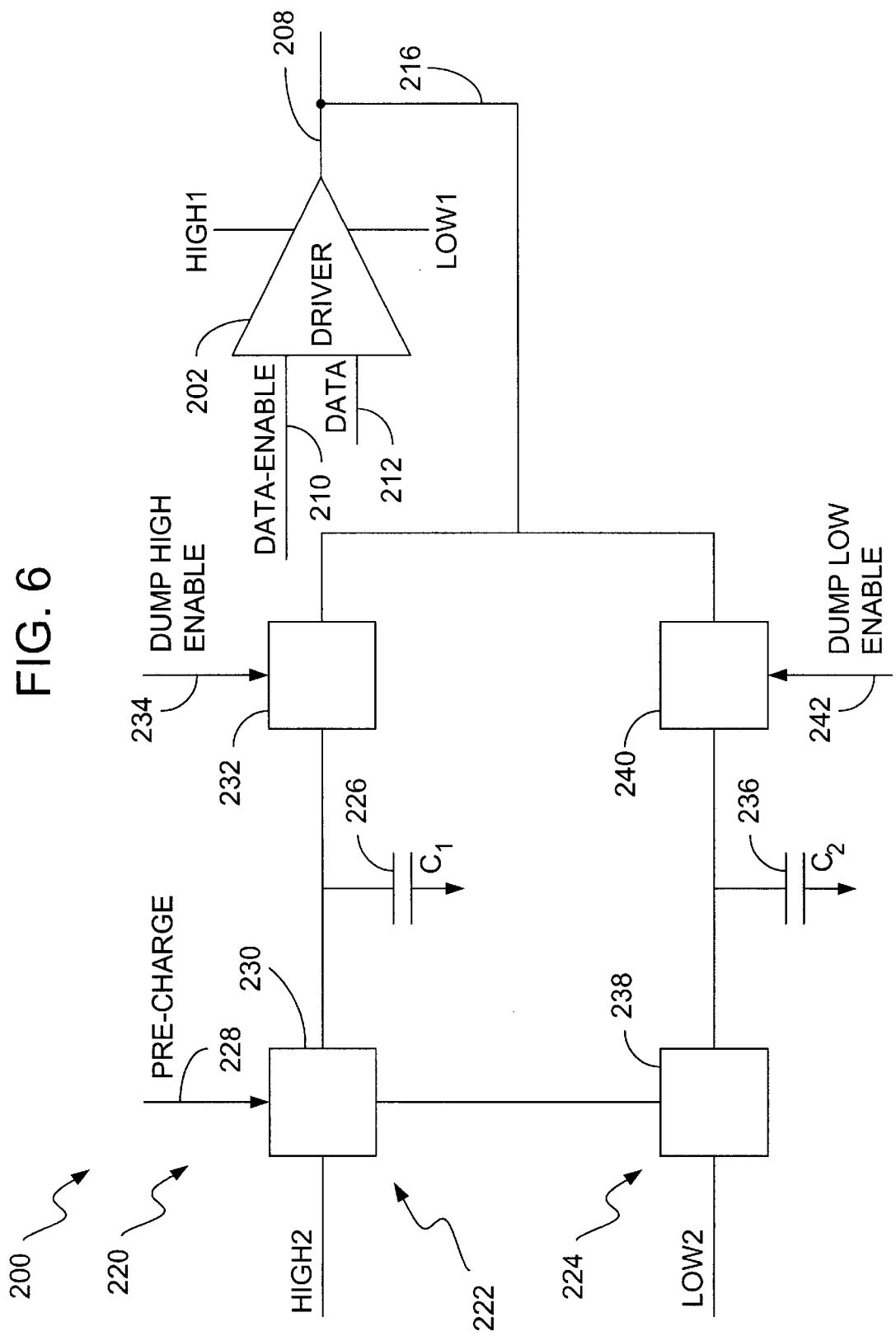
FIG. 6 is a schematic diagram depicting an alternative embodiment of the present invention.

Referring now to FIG. 6, an alternative embodiment 200 of the present invention will be described. As shown therein, system 200 preferably includes a driver 202 which may be PVT controlled and which is configured to provide a pad signal to an IC package (not shown) via line 208. Driver 202 receives inputs from a data-enable line 210 and a data line 212 and is configured to provide chip pad signals, preferably, in the form of either HIGH1 or LOW1. System 200 also is configured to dump additional voltage/charge to the IC package, such as to a pad (not shown) of the package via line 216, through the use of one or more dump caps 220. Preferably, dump cap 220 includes a dump-high stage 222 for augmenting the voltage/charge of the chip pad signal supplied by the driver 202 during a signal "high" (HIGH1), and a dump-low stage 224 for augmenting the voltage/ charge of the chip pad signal supplied by the driver during a signal "low" (LOW1).

Preferably, dump-high stage 222 includes a capacitor 226 ($C_1$), which receives a charge from a pre-charge signal 228 delivered via control block 230, and a dump high-enable component or control block 232 which is configured to receive a dump high enable signal 234. So configured, when the capacitor 226 is appropriately charged and the dump high-enable control block 232 receives the dump high-enable signal 234, the charge accumulated at the capacitor 226 is applied to the chip pad signal as described hereinbefore. Similarly, dump-low stage 224 includes a capacitor 236 ($C_2$), which receives a charge from the pre-charge signal 228 delivered via control block 238, and a dump low-enable component or control block 240 which is configured to receive a dump low-enable signal 242. So configured, when the capacitor 236 is appropriately charged and the dump low-enable control block 240 receives the dump low-enable signal 242, the charge accumulated at the capacitor 236 is applied to the chip pad signal as described hereinbefore.

Figure 7:
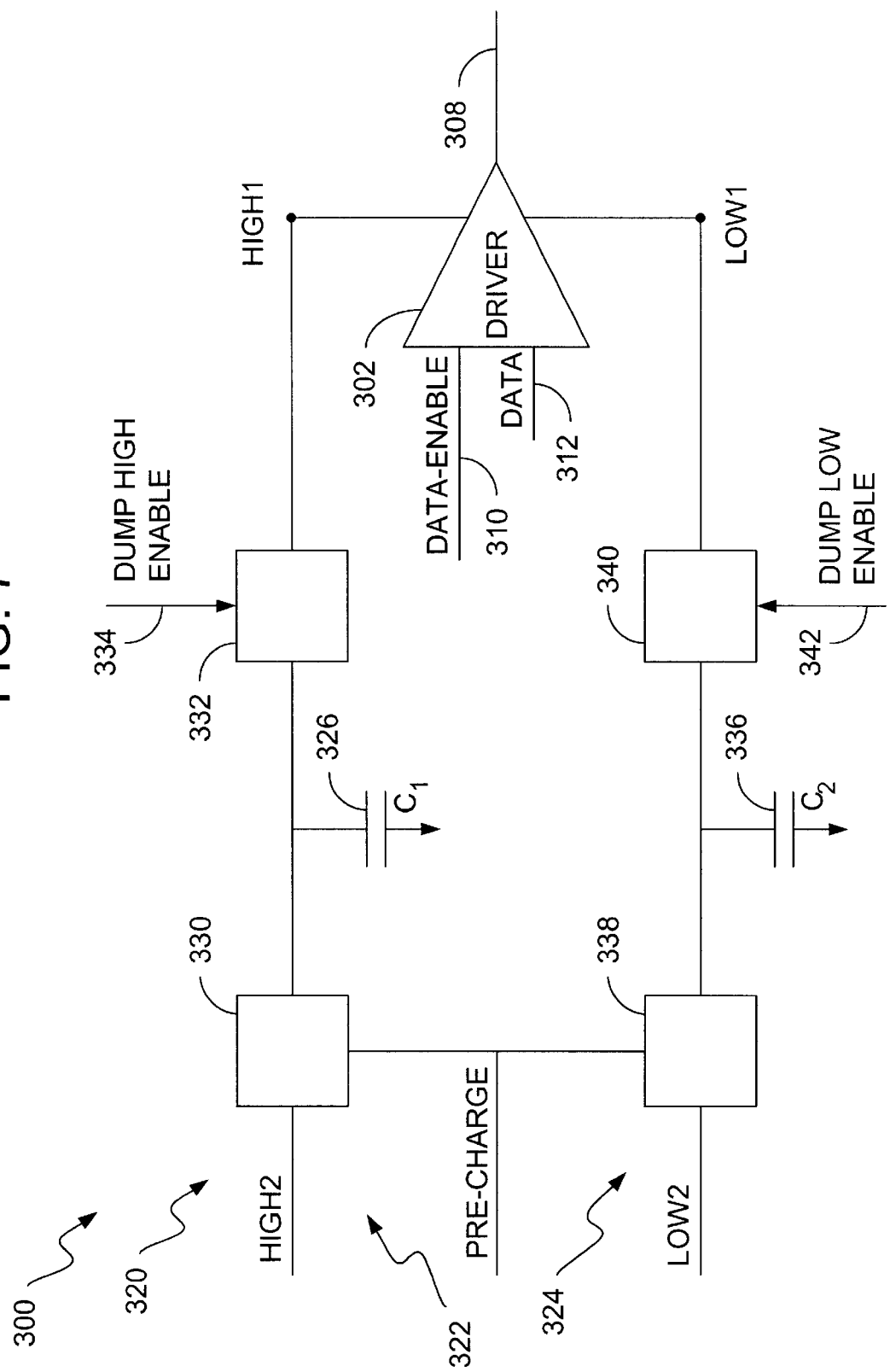
FIG. 7 is a schematic diagram depicting an alternative embodiment of the present invention.

Referring now to FIG. 7, an alternative embodiment 300 of the present invention will be described. As shown therein, system 300 preferably includes a driver 302 which may be PVT controlled and which is configured to provide a pad signal to an IC package (not shown) via line 308. Driver 302 receives inputs from a data-enable line 310 and a data line 312 and is configured to provide chip pad signals, preferably, in the form of either HIGH1 or LOW1. System 300 also is configured to dump additional voltage/charge to the package through the use of one or more dump caps 320. In contrast to the dump cap 220 depicted in FIG. 6, the dump cap 320 depicted in FIG. 7 is configured to dump voltage/charge directly to the VDD and GND supplies of the driver, thereby providing a localized increase in voltage/charge of the chip pad signal.

Dump cap 320 preferably includes a dump-high stage 322 for augmenting the voltage/charge of the VDD of the driver during a signal "high," and a dump-low stage 324 for augmenting the voltage/charge of the GND of the driver during a signal "low".

Preferably, dump-high stage 322 includes a capacitor 326 ($C_1$), which receives a charge from a pre-charge signal 328 delivered via control block 330, and a dump high enable control block 332 which is configured to receive a dump high-enable signal 334. So configured, when the capacitor 326 is appropriately charged and the dump high-enable control block 332 receives the dump high-enable signal 334, the charge accumulated at the capacitor 326 is applied to the VDD of the driver as described hereinbefore. Similarly, dump-low stage 324 includes a capacitor 336 ($C_2$), which receives a charge from the pre-charge signal 328 delivered via control block 338, and a dump low-enable control block 340 which is configured to receive a dump low-enable signal 342. So configured, when the capacitor 336 is appropriately charged and the dump low-enable control block 340 receives the dump low-enable signal 342, the charge accumulated at the capacitor 336 is applied to the GND of the driver as described hereinbefore.

The foregoing description has been presented for purposes of illustration and description. It is not intended to be exhaustive or to limit the invention to the precise forms disclosed. Obvious modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated. All such modifications and variations, are within the scope of the invention as determined by the appended claims when interpreted in accordance with the breadth to which they are fairly and legally entitled.

What is claimed is:

1. A circuit for altering a chip pad signal, the chip pad signal having a first logic high and a first logic low, the first logic high having a voltage higher than a voltage of the first logic low, the chip pad signal being adapted as an input for an IC package such that the IC package provides a board signal as an output, said circuit comprising:

a primary driver configured to deliver a chip pad signal to an IC package, said circuit being configured to cooperate with a second signal and a third signal, the second signal having a voltage higher than the voltage of the first logic high such that said primary driver selectively delivers a second logic high to the IC package, said second logic high having a voltage higher than the voltage of the first logic high, the third signal having a voltage lower than the voltage of the first logic low such that said primary driver selectively delivers a second logic low to the IC package, said second logic low having a voltage lower than the voltage of the first logic low.

2. The circuit of claim 1, further comprising a secondary driver configured to provide the second signal and the third signal.

3. The circuit of claim 1, further comprising:

a first capacitor selectively electrically communicating with said primary driver, said first capacitor being configured to selectively provide the first signal; and a second capacitor selectively electrically communicating with said primary driver, said second capacitor being configured to selectively provide the third signal.

4. The circuit of claim 1, wherein the sixth signal is terminated to ground.

5. The circuit of claim 2, wherein said primary driver is adapted to receive a primary driver first signal, and wherein said circuit further comprises:

a signal modifier electrically communicating with said secondary driver, said signal modifier being adapted to receive said primary driver first signal to convert said primary driver first signal into a secondary driver first signal and to provide said secondary driver first signal to said secondary driver.

6. The circuit of claim 5, wherein said primary driver is adapted to receive a primary driver first signal, and wherein said circuit further comprises:

means for modifying said primary driver first signal and for providing said primary driver first signal, after modification, to said secondary driver.

7. The circuit of claim 5, wherein said signal modifier is a pulse generator.

8. The circuit of claim 7, wherein said primary driver has PVT controls.

9. An electrical device comprising:

an IC package; and a circuit electrically communicating with said IC package, said circuit having a primary driver configured to deliver a chip pad signal to said IC package in response to a primary driver first signal and a primary driver second signal, the primary driver first signal and the primary driver second signal each being adapted to provide a logic high and a logic low to said primary driver such that, in response to a logic high received concurrently from the primary driver first signal and the primary driver second signal, said primary driver provides a primary driver third signal for forming said chip pad signal, and, in response to a logic low received from either the primary driver first signal or the primary driver second signal, said primary driver provides a primary driver fourth signal for forming said chip pad signal;

said circuit being configured to receive a fifth signal having a voltage higher than a voltage of the primary driver third signal, and a sixth signal having a voltage lower than a voltage of the primary driver fourth signal, wherein said chip pad signal is adapted to be formed from at least three of the group consisting of: the primary driver third signal; a summation of the fifth signal and the primary driver third signal; the primary driver fourth signal, and; a summation of the sixth signal and the primary driver fourth signal.

10. The electrical device of claim 9, wherein the primary driver first signal is a data-enable signal, and the primary driver second signal is a data signal.

11. The electrical device of claim 9, further comprising:
a first capacitor selectively electrically communicating with said primary driver such that said first capacitor is configured to selectively provide the fifth signal for forming the chip pad signal; and
a second capacitor selectively electrically communicating with said primary driver such that said second capacitor is configured to selectively provide the sixth signal for forming the chip pad signal.

12. The electrical device of claim 11, further comprising a first dump-enable component electrically communicating with said first capacitor and having an enable state and a disable state, and a second dump-enable component electrically communicating with said second capacitor and having an enable state and a disable state, and wherein said first capacitor selectively electrically communicates with said primary driver via said first dump-enable component when said first dump-enable component is in said enable state, and said second capacitor selectively electrically communicates with said primary driver via said second dump-enable component when said second dump-enable component is in said enable state.

13. A circuit for altering a chip pad signal, the chip pad signal being adapted as an input for an IC package such that the IC package provides a board signal as an output, said circuit comprising:
a primary driver having a primary driver first input, a primary driver second input, a primary driver third input, a primary driver fourth input and a primary driver output, said primary driver being configured to deliver a chip pad signal, via said primary driver output, to an IC package in response to inputs from a primary driver first signal, a primary driver second signal, a primary driver third signal, and a primary driver fourth signal, said primary driver first signal and said primary driver second signal each being adapted to provide a logic high and a logic low to said primary driver, via said primary driver first input and said primary driver second input, respectively, such that, in response to a logic high received concurrently from said primary driver first signal and said primary driver second signal, said primary driver provides said primary driver third signal to said primary driver output as the chip pad signal, and, in response to a logic low received from either said primary driver first signal or said primary driver second signal, said primary driver provides said primary driver fourth signal to said primary driver output as the chip pad signal;

said circuit being configured to receive a fifth signal having a voltage higher than a voltage of said primary driver third signal, and a sixth signal having a voltage lower than a voltage of said primary driver fourth signal,
wherein the chip pad signal is adapted to be formed from at least three of the group consisting of: said primary driver third signal; a summation of said fifth signal and said primary driver third signal; said primary driver fourth signal, and; a summation of said sixth signal and said primary driver fourth signal.

14. The circuit of claim 13, further comprising a secondary driver configured to provide said fifth signal and said sixth signal for forming the chip pad signal.

15. The circuit of claim 13, further comprising:
a first capacitor selectively electrically communicating with said primary driver output such that said first capacitor is configured to selectively provide said fifth signal for forming the chip pad signal; and
a second capacitor selectively electrically communicating with said primary driver output such that said second capacitor is configured to selectively provide said sixth signal for forming the chip pad signal.

16. The circuit of claim 13, wherein said primary driver third signal is received at said primary driver third input, and said primary driver fourth signal is received at said primary driver fourth input, and wherein said circuit further comprises:
a first capacitor selectively electrically communicating with said primary driver third input such that said first capacitor is configured to selectively provide said fifth signal to said primary driver for forming the chip pad signal; and
a second capacitor selectively electrically communicating with said primary driver fourth input such that said second capacitor is configured to selectively provide said sixth signal to said primary driver for forming the chip pad signal.

17. The circuit of claim 14, wherein said secondary driver has a secondary driver first input, a secondary driver second input, a secondary driver third input, a secondary driver fourth input and a secondary driver output, said secondary driver being configured to deliver said fifth signal, via said secondary driver output, in response to a logic high received concurrently from a secondary driver first signal and said primary driver second signal, said secondary driver being further configured to deliver said sixth signal, via said secondary driver output, in response to a logic low received from either said secondary driver first signal or said primary driver second signal.

* * * * *